United States Patent [19]
Bexten

[11] Patent Number: 6,125,863
[45] Date of Patent: Oct. 3, 2000

[54] OFFSET ROTOR FLAT MEDIA PROCESSOR

[75] Inventor: Daniel P. Bexten, Kalispell, Mont.

[73] Assignee: Semitool, Inc., Kalispell, Mont.

[21] Appl. No.: 09/107,878

[22] Filed: Jun. 30, 1998

[51] Int. Cl.$^7$ ..................................................... B08B 3/02
[52] U.S. Cl. ..................... 134/95.2; 134/159; 134/102.3; 134/902; 134/186
[58] Field of Search ..................................... 134/95.2, 902, 134/184, 186, 102.3, 140, 141, 149, 153, 157, 159; 210/360.1, 364, 367, 365; 494/27, 29, 84; 34/595, 602, 601

[56] References Cited

U.S. PATENT DOCUMENTS

| | | |
|---|---|---|
| Re. 28,135 | 8/1974 | Hull . |
| 193,222 | 7/1877 | Buell . |
| 910,882 | 1/1909 | Truesdell . |
| 1,035,480 | 8/1912 | Schodde . |
| 1,405,243 | 1/1922 | Wing . |
| 1,793,798 | 2/1931 | Harker . |
| 2,225,501 | 12/1940 | Lapham et al. . |
| 2,573,128 | 10/1951 | Cavicchioli . |
| 2,669,660 | 2/1954 | Gambrill . |
| 2,675,012 | 4/1954 | Scales . |
| 2,677,381 | 5/1954 | Fisher . |
| 2,684,585 | 7/1954 | Smith . |
| 2,699,660 | 1/1955 | Kirby . |
| 2,721,566 | 10/1955 | Brucker . |
| 3,079,286 | 2/1963 | Kearney et al. . |
| 3,116,744 | 1/1964 | Hager . |
| 3,203,434 | 8/1965 | Kipp et al. . |
| 3,214,026 | 10/1965 | Behrens . |
| 3,242,934 | 3/1966 | Heinicke et al. . |
| 3,341,016 | 9/1967 | Paasche . |
| 3,383,255 | 5/1968 | Rossi et al. . |
| 3,443,567 | 5/1969 | Moore . |
| 3,464,429 | 9/1969 | Ehrhardt . |
| 3,489,608 | 1/1970 | Jacobs et al. . |
| 3,526,237 | 9/1970 | Neill, Jr. . |
| 3,585,128 | 6/1971 | Hoffman . |
| 3,585,668 | 6/1971 | Jaccodine et al. . |
| 3,608,567 | 9/1971 | Neill, Jr. . |
| 3,643,671 | 2/1972 | Henninges et al. . |
| 3,664,872 | 5/1972 | Frank et al. . |
| 3,727,620 | 4/1973 | Orr . |
| 3,748,677 | 7/1973 | Frank et al. . |
| 3,756,410 | 9/1973 | Moody et al. . |
| 3,760,822 | 9/1973 | Evans . |
| 3,769,992 | 11/1973 | Wallestad . |
| 3,804,758 | 4/1974 | Cooper et al. . |
| 3,808,065 | 4/1974 | Robinson et al. . |
| 3,853,622 | 12/1974 | Rutten . |
| 3,939,514 | 2/1976 | Cook . |
| 3,964,957 | 6/1976 | Walsh . |
| 3,970,471 | 7/1976 | Bankes et al. . |

(List continued on next page.)

FOREIGN PATENT DOCUMENTS

| | | |
|---|---|---|
| 0 292 090 | 11/1988 | European Pat. Off. . |
| 1477965 | 6/1969 | Germany . |
| 3815018 | 12/1988 | Germany . |
| 61-164226 | 7/1986 | Japan . |
| 1111338 | 4/1989 | Japan . |

OTHER PUBLICATIONS

Mathisen; IBM Tech. Disclosure Bulletin, vol. 10, No. 3 Aug. 1967; Etch Control Probe, pp. 193 & 194.

Takeshi Hattori et al.; Microcontamination, vol. 9, No. 12; Introducing A New PFA Wafer–Carrier Cleaning Technology; Dec. 1991; pp. 17–21.

*Primary Examiner*—Frankie L. Stinson
*Attorney, Agent, or Firm*—Lyon & Lyon LLP

[57] ABSTRACT

A centrifugal processor for flat media, such as a silicon wafer, has a rotor eccentrically positioned within a cylindrical chamber or bowl. Drainage openings or slots are located near the bottom of the bowl. The rotor is offset in a direction away from the drain openings. Fluids drain more quickly from the bowl, as the tendency of the spinning rotor to draw fluids up and around the bowl is reduced, due to the rotor offset and to the discrete drain openings, and the position and orientation of the drain openings.

27 Claims, 6 Drawing Sheets

U.S. PATENT DOCUMENTS

| | | |
|---|---|---|
| 3,990,462 | 11/1976 | Elftmann et al. . |
| 4,027,686 | 6/1977 | Shortes et al. . |
| 4,077,416 | 3/1978 | Johnson, Jr. et al. . |
| 4,092,176 | 5/1978 | Kozai et al. . |
| 4,132,567 | 1/1979 | Blackwood . |
| 4,153,551 | 5/1979 | Hultsch et al. ............................ 210/78 |
| 4,208,760 | 6/1980 | Dexter et al. . |
| 4,226,642 | 10/1980 | Baran . |
| 4,283,286 | 8/1981 | Wilkesmann ............................ 210/365 |
| 4,286,541 | 9/1981 | Blackwood . |
| 4,300,581 | 11/1981 | Thompson . |
| 4,370,992 | 2/1983 | Choudhury et al. . |
| 4,440,185 | 4/1984 | Wiltse . |
| 4,456,022 | 6/1984 | Roberts . |
| 4,458,703 | 7/1984 | Inoue et al. . |
| 4,523,764 | 6/1985 | Albers et al. . |
| 4,536,845 | 8/1985 | DeVale et al. . |
| 4,571,850 | 2/1986 | Hunt et al. ............................... 34/242 |
| 4,682,614 | 7/1987 | Silvernail et al. . |
| 4,693,017 | 9/1987 | Oehler et al. . |
| 4,694,527 | 9/1987 | Yoshizawa . |
| 4,731,154 | 3/1988 | Hazlitt et al. . |
| 4,745,422 | 5/1988 | Matsuoka et al. . |
| 4,750,505 | 6/1988 | Inuta et al. . |
| 4,753,258 | 6/1988 | Seiichiro . |
| 4,788,994 | 12/1988 | Shinbara . |
| 4,828,660 | 5/1989 | Clark et al. . |
| 4,871,417 | 10/1989 | Nishizawa et al. . |
| 4,903,717 | 2/1990 | Sumnitsch . |
| 4,907,349 | 3/1990 | Aigo . |
| 4,941,489 | 7/1990 | Kamimura et al. . |
| 4,982,215 | 1/1991 | Matsuoka . |
| 4,982,753 | 1/1991 | Grebinski, Jr. et al. . |
| 5,000,208 | 3/1991 | Ludwig et al. . |
| 5,022,419 | 6/1991 | Thompson et al. ..................... 134/102 |
| 5,027,841 | 7/1991 | Breunsbach et al. . |
| 5,069,236 | 12/1991 | Pierson . |
| 5,095,927 | 3/1992 | Thompson et al. ..................... 134/102 |
| 5,154,199 | 10/1992 | Thompson et al. ..................... 134/111 |
| 5,174,045 | 12/1992 | Thompson et al. ........................ 34/58 |
| 5,232,328 | 8/1993 | Owczarz et al. ........................ 414/222 |
| 5,361,449 | 11/1994 | Akimoto . |
| 5,664,337 | 9/1997 | Davis et al. ............................... 34/58 |
| 5,784,797 | 7/1998 | Curtis et al. ............................... 34/58 |

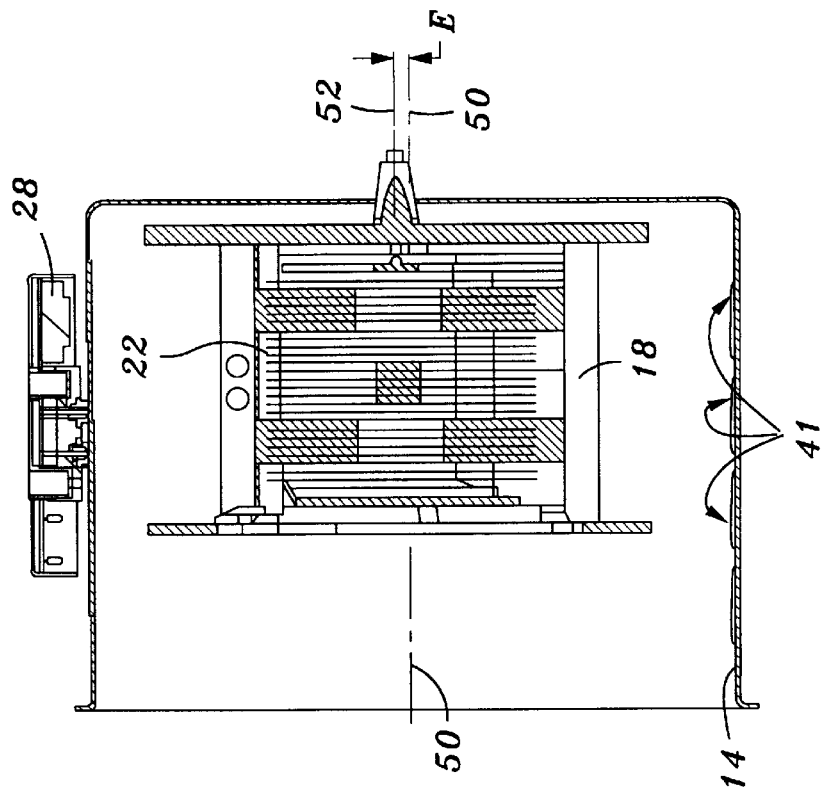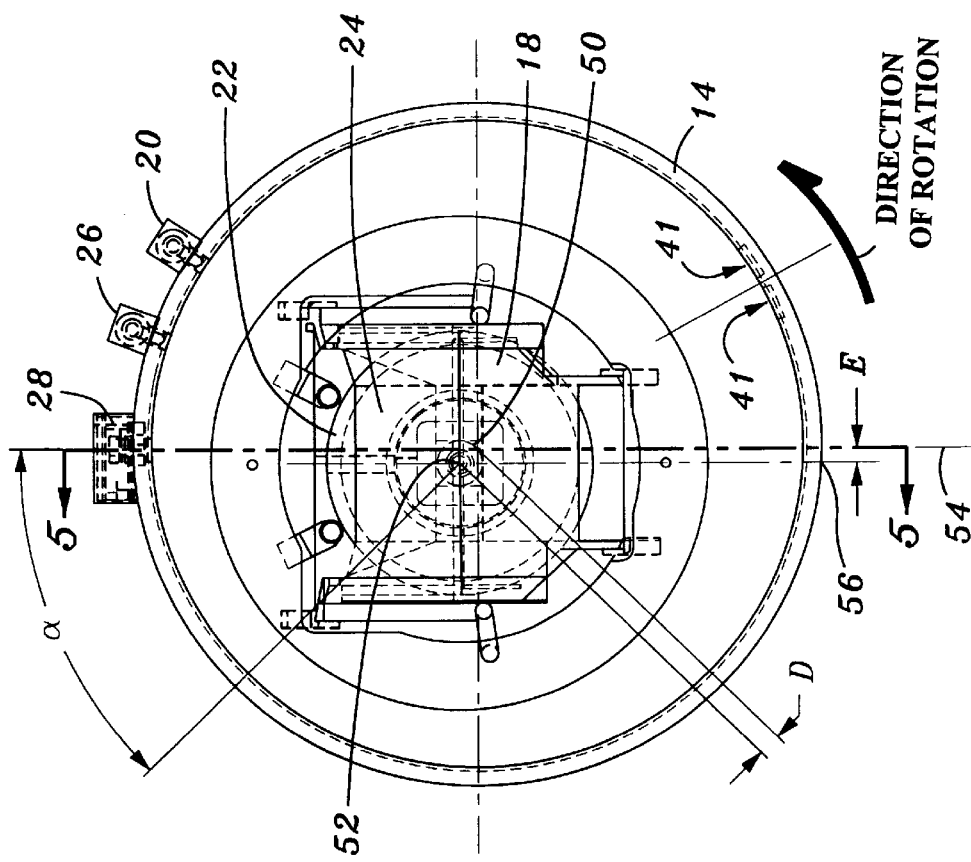

OFFSET ROTOR FLAT MEDIA PROCESSOR

TECHNICAL FIELD

The technical field of this invention is centrifugal processing equipment and methods used to process semiconductor wafers, photomasks, optical and glass disks, magnetic disks, flat panels, lenses or similar flat media.

BACKGROUND OF THE INVENTION

The production of semiconductor wafers, substrates and photomask plates used in the manufacture of semiconductor wafers, has typically utilized processing equipment in which various types of processing fluids are used to treat the wafers. One example of a semiconductor processor is a centrifugal rinser-dryer used to rinse acids, caustics, etchants and other processing fluids from wafers, photomask plates, and similar flat media.

The rinser-dryers are also used to dry the rinsed units using a flow of heated gas, such as nitrogen, which is passed through the processing chamber after rinsing with the desired fluid. The wafers are spun during processing to provide more even distribution of the processing fluids across the wafer surfaces, and to assist in removal of rinsing liquids in preparation for drying.

Other types of semiconductor processors include acid, solvent, and caustic treatment machines which spray or otherwise apply acids, solvents and caustics to the wafers or other flat media. Stripping processors are used to remove photoresist from the wafers. Other specific processing of semiconductors may require other types of chemicals. Many of these processes are performed in centrifugal processing machines to provide for even distribution of fluids over the wafer and to aid in removal of liquids.

A primary problem in the production of semiconductors is particle contamination. Contaminant particles can affect the photographic processes used to transfer the chip layouts onto the wafers being processed into chips. Contaminants on the photomasks can cause deterioration of the image being transferred onto the wafer. The direct processing of the wafers themselves is even more susceptible to contamination because of the numerous processing steps involved and the risk at each stage that contaminating particles can become adhered to the surface of the wafer. Particle contamination causes a large number of the chips in a wafer to be defective. Thus it is very important to reduce contamination to increase yields.

With the high resolution now made possible through newer semiconductor processing techniques, the effects of contaminants have become even more significant and problematic than in the past. Previously, contaminant particles smaller than 1 micron did not result in defects due to minimum feature sizes of 2 microns or more. However, now the feature size used in high density chip designs is substantially less, e.g., 0.18 micron. Even higher density chips with even smaller feature sizes are expected in the future. The move toward smaller feature size is compounding the contamination problem because of the greater difficulty in controlling smaller particles in the environment. If contaminants are present then substantial numbers of the resulting chips can be rendered defective and unusable, at substantial costs to the manufacturer.

The causes of contaminating particles on wafer surfaces occurs from numerous sources. Each of the processing fluids used is necessarily impure to some small degree. The water used in processing is deionized to remove metallic ions and other impurities, but such supplies also contain some impurities. Centrifugal processing is advantageous because spinning the wafers or other flat media flings off fluid droplets. This helps to prevent contamination by "spotting" which occurs if fluid droplets on the wafer evaporate. It is also advantageous to have the used rinse water or fluids removed from the processing chamber as quickly as possible, to prevent recontamination.

Centrifugal processors, such as spray solvent and spray acid processors, and spin rinser dryers, typically have a rotor which spins inside of a cylindrical processing chamber or bowl. The cylindrical rotor holds a removable cassette or non-removable combs which carry the wafers. As shown in FIG. 2, and as described in U.S. Pat. No. 5,022,419, incorporated herein by reference, the bowl typically has a drainage ditch or channel running from the front to the rear, near the bottom of the bowl, to drain fluids out of the bowl. These types of centrifugal processors have been used very successfully in semiconductor manufacturing.

However, in these types of centrifugal processors, the spinning rotor, which is centered in the bowl, generates rapid counter-clockwise air movement within the bowl. This air movement hinders the clean drying or other processing operation of the centrifugal processor, as it tends to draw spent fluid droplets of e.g., water, solvent, or acid, up and around in the bowl, allowing droplets to be re-deposited on the wafers or other flat media. The air movement also tends to draw droplets away from the drainage channel, allowing them to be disadvantageously recycled back up and around the bowl.

Accordingly, there remains a need in semiconductor manufacturing for improved centrifugal processing machines.

SUMMARY OF THE INVENTION

The present invention is directed to a centrifugal processor with a rotor contained within a bowl or chamber which is designed to better direct and scavenge fluids from the bowl. By doing so, a more complete process can be accomplished with less risk of contamination from spent fluid.

In a first separate aspect of the present invention, the centrifugal processor includes a rotor offset from the centerline of the bowl. The offset provides an area of lower fluid velocities. Thus, separation of entrained fluid droplets from the rotating air or gas flow is enhanced.

In a second separate aspect of the present invention, the centrifugal processor includes drain openings in the form of staggered slots. The slots quickly remove spent fluid from the bowl and inhibit any re-entraining of the fluid into the air flow within the bowl.

In a third separate aspect of the present invention, the slots of the second separate aspect include peripheries which are not perpendicular to the flow. With such a configuration, fluid droplets accumulate and more readily fall out of the bowl.

In a fourth separate aspect of the present invention, any one or more of the foregoing separate aspects are contemplated to be combined to enhance removal of fluid droplets.

Accordingly, an object of the present invention is to provide an improved centrifugal processor, which more effectively removes used fluid from the bowl, thereby reducing the potential for recontamination of the silicon wafers or other flat media.

BRIEF DESCRIPTION OF THE DRAWINGS

Other objects and features of the invention will become apparent from the following detailed description and drawings, which disclose two embodiments of the invention. It should be understood, however, that the drawings are designed for illustration only, and are not intended as a definition of the limits of the invention.

In the drawings, wherein similar reference characters denote similar elements throughout the several views:

FIG. 4 is a front elevation view of the bowl and rotor of the centrifugal processor shown in FIG. 1;

FIG. 5 is a section view taken along line 5—5 of FIG. 4;

DETAILED DESCRIPTION OF THE DRAWINGS

Figure 1:
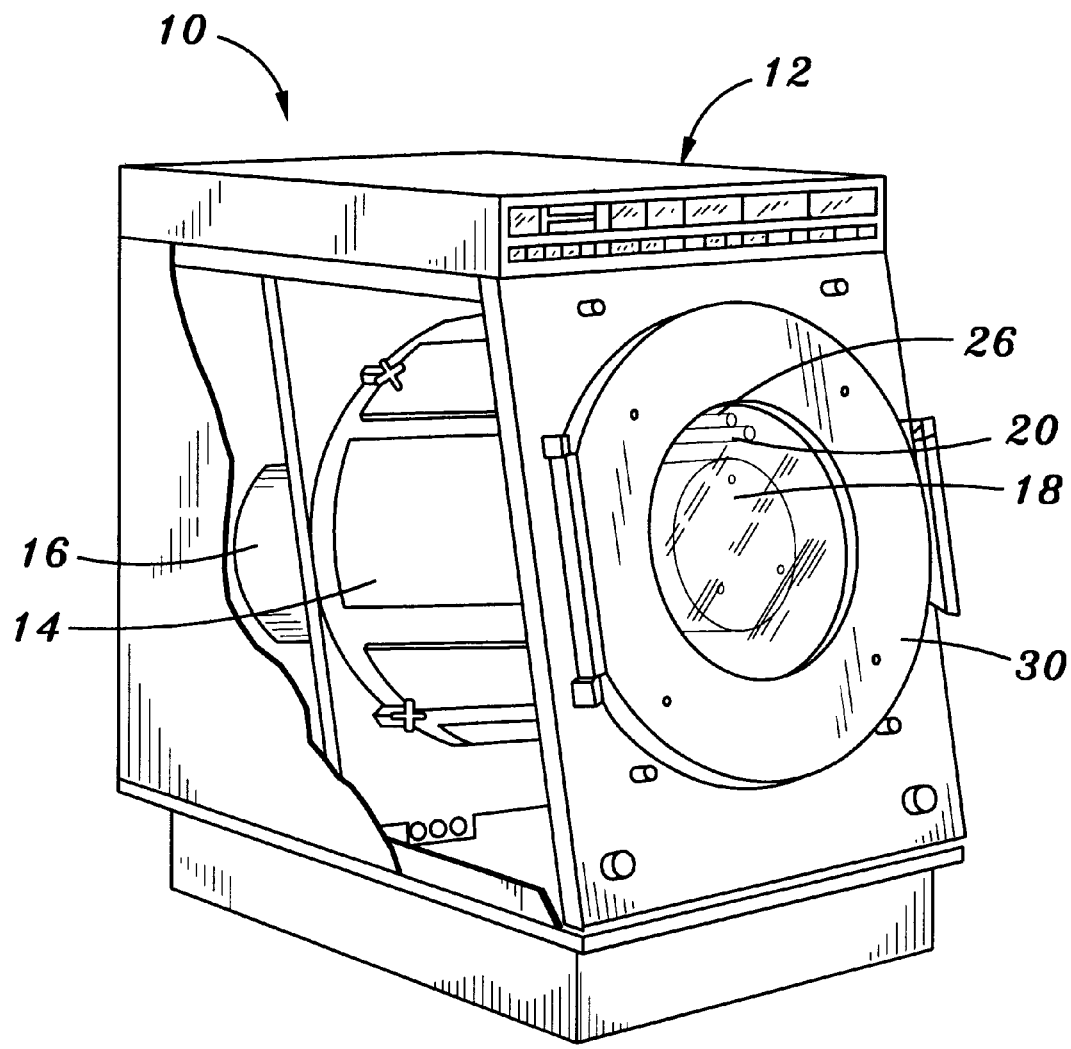
FIG. 1 is a perspective view of the centrifugal processor of the invention.
Figure 9:
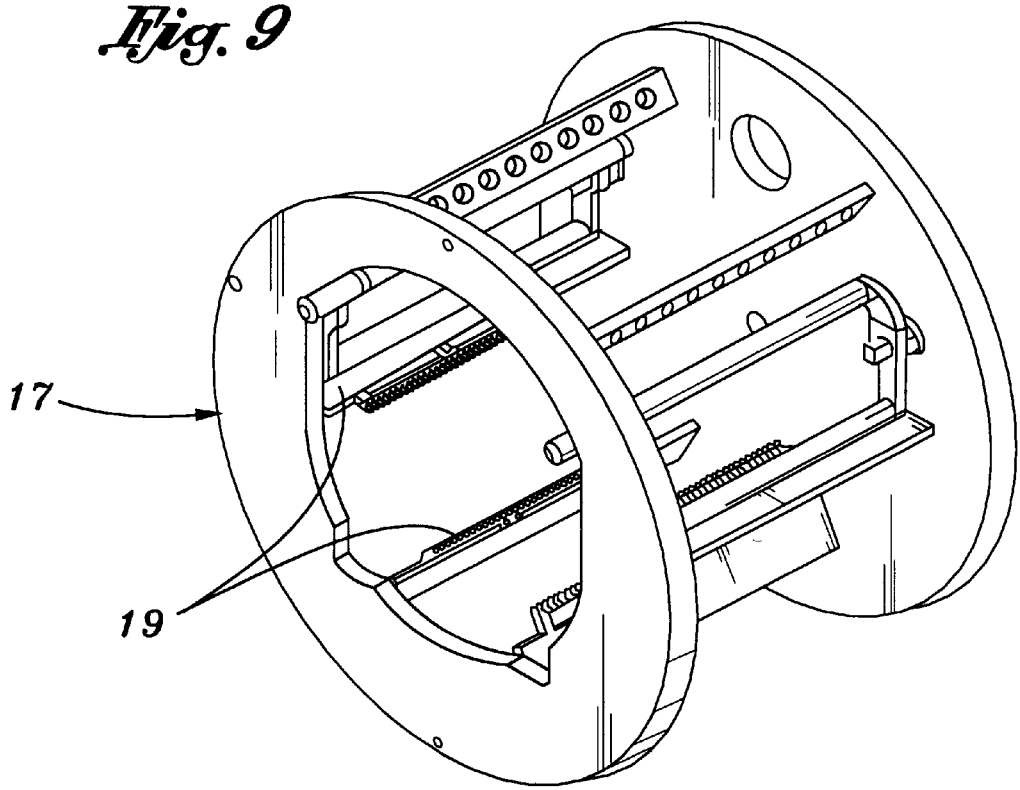
FIG. 9 is a perspective view of a comb rotor having combs for directly holding wafers or other flat media.
Figure 10:
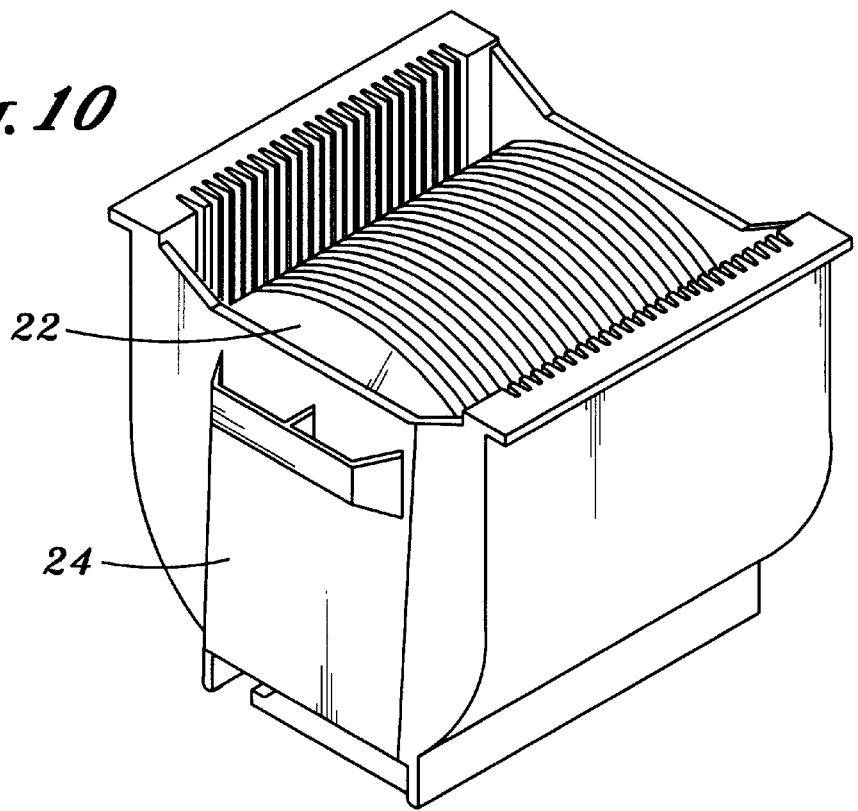
FIG. 10 is a perspective view of a cassette holding wafers, with the cassette placeable into the rotor shown in FIGS. 3 and 6.

Turning now in detail to the drawings, as shown in FIG. 1, the present centrifugal processor 10 has a cylindrical bowl 14 mounted within a housing 12. Referring to FIGS. 1, 4 and 5, a cylindrical cassette rotor 18 is rotatably mounted within the bowl 14. The back end of the rotor 18 is connected to a drive motor 16, which spins the rotor within the bowl 14. The workpieces 22 are held within the rotor 18, in a wafer cassette 24, as shown in FIG. 10, placed within the rotor 18. Alternatively, a comb rotor 17, having combs 19 for directly holding the wafers 22, as shown in FIG. 9, may be used. The techniques for holding wafers in the combs, or for holding the wafer cassette, in a rotor, as shown in FIGS. 9 and 10, are well known in the art, as described, for example, in U.S. Pat. Nos. 5,664,337 and 5,232,328, incorporated herein by reference. The workpieces 22 may be semiconductor wafers, metal or glass disks, flat panels, lenses, or other flat media. The bowl is advantageously oriented at a rearwardly sloping angle of approximately 10 degrees from horizontal, although inclination in the approximate range of 0°–30° are also suitable.

One or more fluid spray manifolds, such as manifolds 20 and 26 are positioned near the top of the bowl 14. The wafers 22 or cassette 24 are loaded into the rotor 18 via a swing out door 30. The manifolds may spray out liquid such as water, solvents, or acids, or gases, such as nitrogen. Depending on the type of centrifugal processing performed, an ionizer 28 may also be provided.

Referring to FIGS. 4 and 5, wherein the illustrated features are drawn to scale, the rotor horizontal centerline or spin axis 52 is offset above and to one side of the bowl centerline 50. As shown in FIG. 4, the rotor spin axis is diagonally displaced from the bowl centerline 50, by a distance D, and at an angle α from vertical.

In an embodiment having a bowl inside diameter of about 35 cm, D is preferably about 1.3 cm and α is about 45°. Correspondingly, the distance E between the vertical centerline 56 of the rotor, and the vertical centerline 54 of the bowl 14 is about 0.9 cm.

Figure 3:
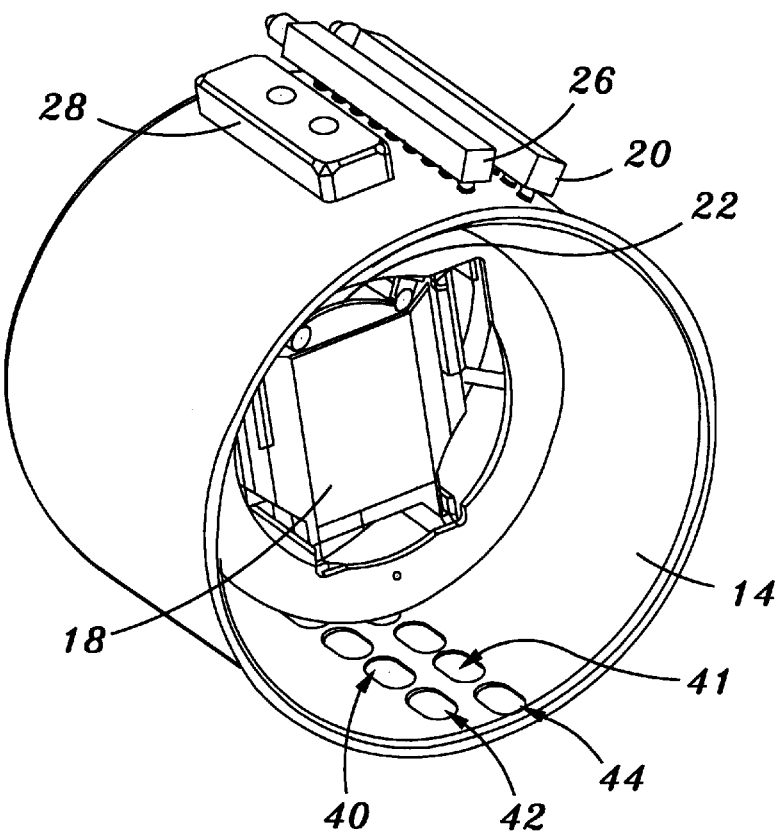
FIG. 3 is a perspective view of the bowl of the present centrifugal processor shown in FIG. 1.

Referring to FIG. 3, drain openings 41 are provided in a cluster 40 near the bottom of the bowl 14. The openings 41 pass through the cylindrical sidewall of the bowl 14. The openings 41 are arranged in a first row 42 staggered or offset from a second row 44. The rotor 18 spins counter-clockwise in FIGS. 1, 3 and 4. The cluster 40 of drain openings 41 is located at or between the 5 o'clock (30° counter-clockwise up from bottom center) and 6 o'clock (bottom center) positions.

Figure 2:
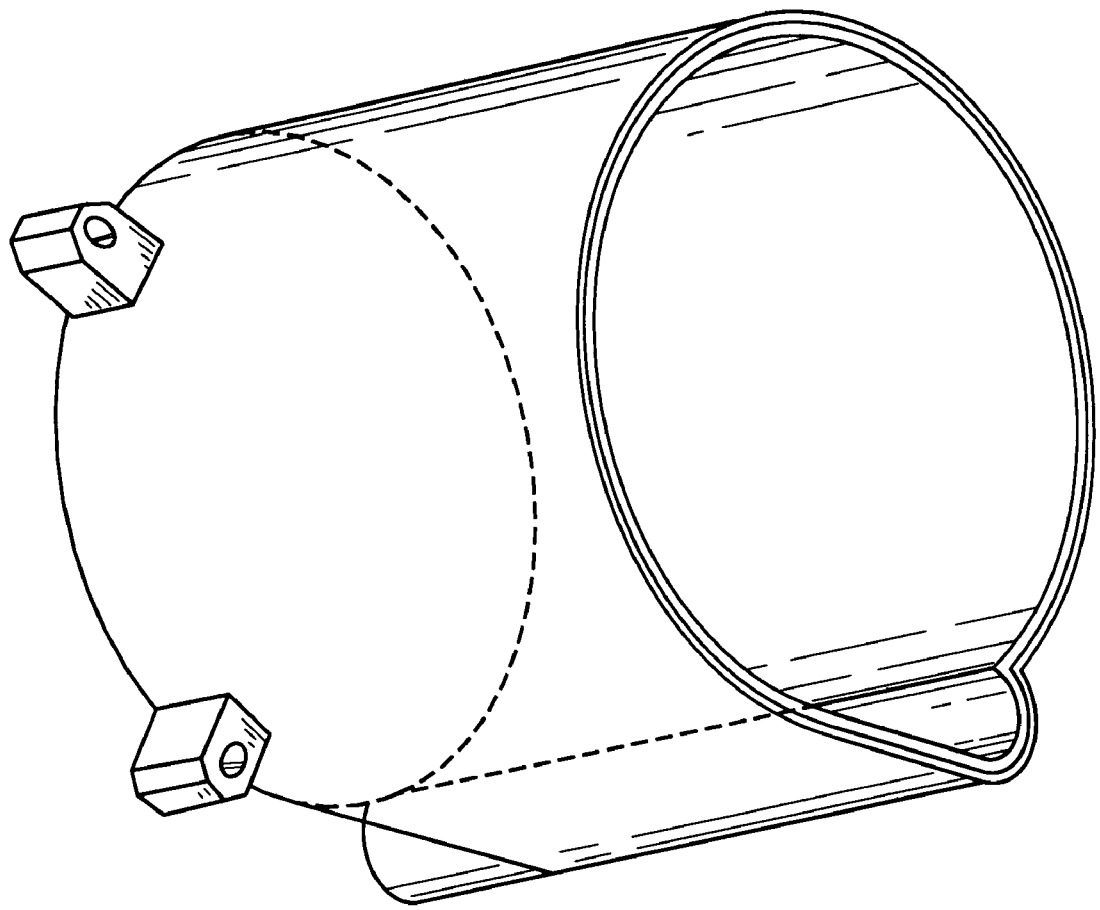
FIG. 2 is a perspective view of a bowl of a prior art machine.

In use, the motor 16 spins the rotor 18. As shown in FIG. 4, the rotor 16 is offset in a direction away from the openings 41. This offset position helps to avoid low pressure over the openings 41, which reduces the tendency of the spinning rotor to draw fluid droplets up and away from the openings 41. In addition, since the drainage route out of the bowl 14 is made up of individual openings 41, in contrast to the continuous drain channel used in prior designs, spent fluid drains more quickly from the bowl 14. The combination of the offset rotor and openings 41 also allows spent fluid droplets which fall to the bottom of the bowl to exit the bowl under gravity via the openings, rather than splashing back onto and contaminating the wafers or workpieces. A drainage channel under the openings 41, similar to the channel shown in FIG. 2, catches the droplets and carries them to a drain.

Figure 6:
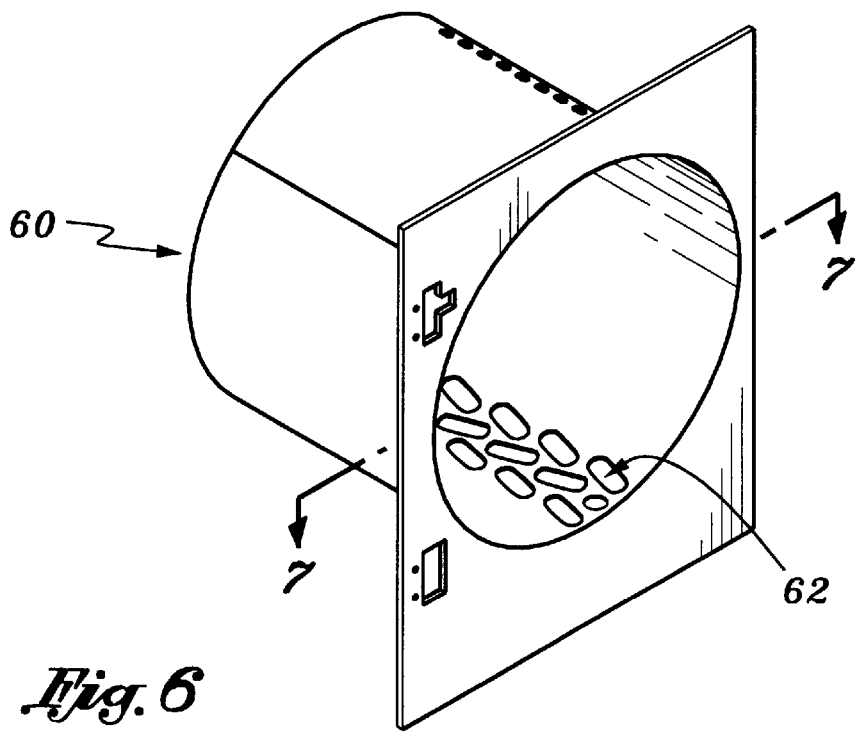
FIG. 6 is a perspective view of a bowl according to a second embodiment of the invention.
Figure 8:
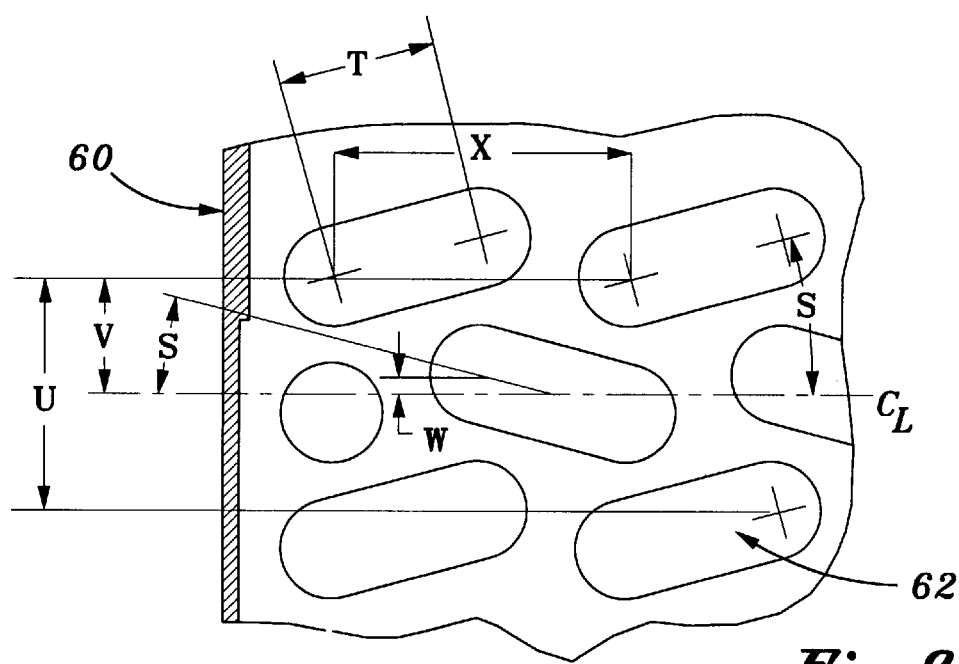
FIG. 8 is an enlarged detail of the openings shown in FIGS. 6 and 7.

FIGS. 6 and 8 show an alternative embodiment having a bowl 60 including alternating pairs of aligned drainage holes 62. The drainage holes are elliptical or oval-shaped. The major axis of each hole extends at an angle of about 30° to the major axes of the adjacent holes in the adjacent row. As the spinning rotor 18 generates air movement in the direction A shown in FIG. 6, fluid droplets clinging to an edge of an opening 62 move toward the down wind (right side in FIG. 6) of the openings 62, and collect at the down wind radius of the hole. As the droplets collect at the radius, and the volume of fluid builds up, the force of gravity surpasses the surface tension adhesion forces and aerodynamic forces. The droplet then falls through the opening, to a collection pipe or channel on the outside of the bowl 14.

Figure 7:
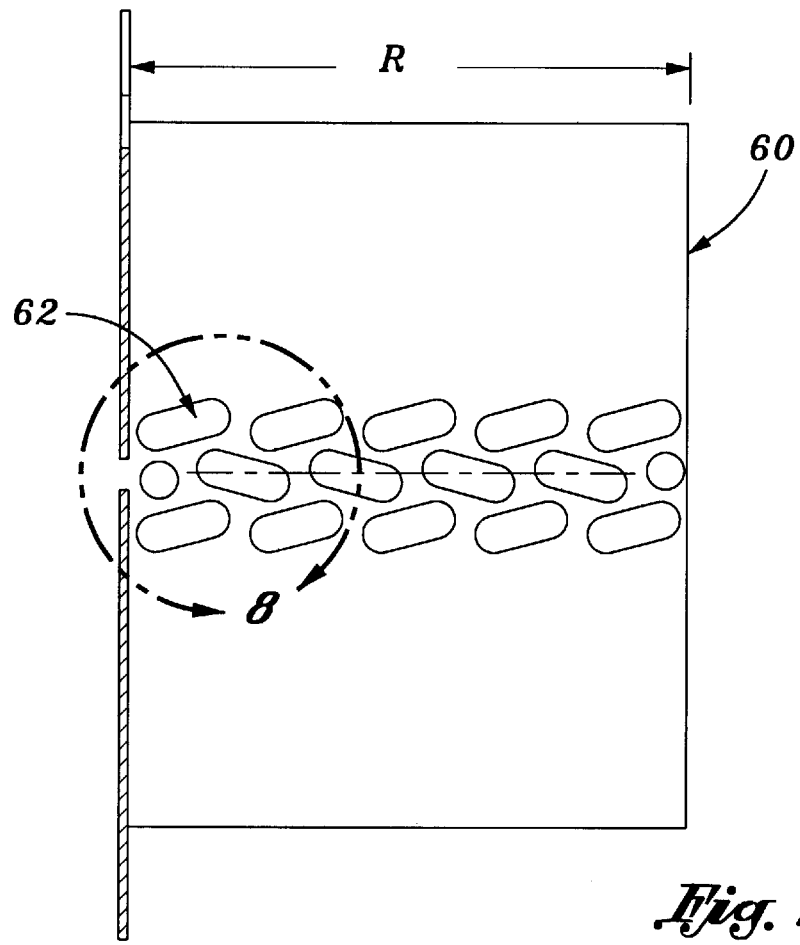
FIG. 7 is a section view taken along line 7—7 of FIG. 6.

As shown in FIGS. 7 and 8, in a preferred embodiment having a bowl depth R of about 11 inches, three rows of openings 62 are provided, with each row having 5 openings. In the embodiment shown, the angles and dimensions S; T; U; V; W; and X are 15°; 1.13; 1.75; 0.88; and 2.25 inches respectively, with the other dimensions shown proportionally to scale.

Thus, a novel centrifugal processor has been shown and described. Various modifications, changes, and substitutions of equivalents may of course be used, without departing from the spirit and scope of the invention. The invention, therefore, should not be limited, except by the following claims, and their equivalents.

I claim:

1. A centrifugal processor comprising:
   a housing;
   a bowl within the housing;
   at least one drain opening in the bowl; and
   a rotor within the bowl and rotatable about a spin axis linearly offset from a centerline of the bowl in a direction away from the at least one drain opening, to reduce the tendency of the spinning rotor to draw fluid droplets away from the at least one opening.

2. The centrifugal processor of claim 1 wherein the rotor is linearly offset vertically and to a first side of the bowl.

3. The centrifugal processor of claim 1 further comprising a plurality of drain openings in the bowl.

4. The centrifugal processor of claim 3 further comprising a motor for spinning the rotor in counterclockwise direction, wherein the drain openings are located at or between the bottom of the bowl and a position 45° counterclockwise up from the bottom of the bowl.

5. The centrifugal processor of claim 1 comprising a manifold for spraying out water, solvents, acids, or gases.

6. A centrifugal processor comprising:
a housing;
a cylindrical bowl fixed in place within the housing, the cylindrical bowl having a central bowl axis;
a rotor rotatably mounted within the bowl and rotatable therein about a rotor axis offset from the central bowl axis;
a motor linked to the rotor; and
drain slots passing through the bowl, with at least one of the drain slots closer to the central bowl axis than to the rotor axis, to enhance removal of fluid droplets from the bowl.

7. A machine for processing flat media comprising:
a cylindrical bowl defining a bowl vertical center axis;
at least one drain opening in the bowl; and
a rotor mounted in the cylindrical bowl and rotatable therein about a rotor axis, with the rotor axis not intersecting with the bowl center axis, and offset from the bowl center axis in a direction at least partially away from the at least one drain opening, to avoid low pressure over the at least one drain opening, to enhance removal of fluid from the bowl.

8. The machine of claim 7 further comprising a cluster of drain openings passing through the bowl, with the cluster and the rotor axis on opposite sides of the bowl center axis.

9. The machine of claim 8 wherein the cluster of openings is positioned in the first direction to one side of the bowl vertical center axis.

10. The machine of claim 7 wherein the rotor axis is above the bowl center axis.

11. The machine of claim 7 wherein the rotor axis is offset horizontally to one side of the bowl axis.

12. The machine of claim 7 wherein the rotor axis is spaced apart from the bowl center by about 0.5 inches.

13. The machine of claim 7 further comprising oblong drain openings passing through the bowl, the drain openings each defining a major axis, with the major axis of substantially each drain opening oriented at an angle to the major axis of each adjacent drain opening.

14. A centrifugal processor, comprising:
a bowl;
a rotor within the bowl;
a plurality of oblong drain holes in the bowl, with the drain holes having a major axis and a minor axis; and
a motor for spinning the rotor in a first direction, with the major axis of each oblong hole positioned so that it is not parallel and not perpendicular to the first direction.

15. The centrifugal processor of claim 14 further comprising a flat media holder within the rotor.

16. The centrifugal processor of claim 15 wherein the flat media holder comprises a cassette within a cassette holder within the rotor.

17. The centrifugal processor of claim 15 wherein the flat media holder comprises combs attached to the rotor.

18. The centrifugal processor of claim 14 further comprising a flat media workpiece in the holder, with the workpiece selected from the group consisting of: silicon or other semiconductor material wafers, metal or glass disks, flat panels, replacement lenses used in cataract surgery, photomasks, optical disks, and magnetic disks.

19. The centrifugal processor of claim 14 wherein the bowl is cylindrical and has a centerline, and the rotor is rotatable within the bowl about a spin axis displaced from, and not intersecting with, the centerline.

20. The centrifugal processor of claim 19 wherein the centerline and the spin axis are parallel.

21. The centrifugal processor of claim 19 wherein the rotor is cylindrical, and has a rotor centerline parallel to, but not co-linear with, the bowl centerline.

22. The centrifugal processor of claim 21 wherein the bowl centerline is inclined upwardly at an angle of from 0–30°.

23. A centrifugal processor, comprising:
a cylindrical bowl having a central bowl axis;
at least one opening in the cylindrical bowl;
a rotor having a central rotor axis, with the rotor mounted within the bowl and rotatable within the bowl about the central rotor axis;
and with the central rotor axis positioned above the central bowl axis, and with the at least one opening below the central bowl axis, to reduce redeposition of spent fluid droplets onto a workpiece in the rotor.

24. The centrifugal processor of claim 23 wherein the central rotor axis and the central bowl axis are parallel.

25. The centrifugal processor of claim 23 wherein the central rotor axis is oriented at an angle of from 0–30 degrees above horizontal.

26. A centrifugal processor, comprising:
a bowl having a central bowl axis;
at least one opening in the bowl;
a rotor having a central rotor axis, with the rotor positioned within the bowl and rotatable therein about the central rotor axis, with the at least one opening nearer to the central bowl axis than the central rotor axis, to enhance removal of fluid droplets from the bowl;
and with the central bowl axis and the central rotor axis oriented at a angle of 0–30 degrees above horizontal.

27. The processor of claim 26 wherein the central rotor axis and the central bowl axis are parallel.

* * * * *